(12) United States Patent
Takahashi et al.

(10) Patent No.: US 6,366,091 B1
(45) Date of Patent: Apr. 2, 2002

(54) NUCLEAR MAGNETIC RESONANCE IMAGING METHOD AND APPARATUS THEREFOR

(75) Inventors: Tetsuhiko Takahashi, Soka; Hiromichi Shimizu, Tokyo, both of (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/424,533

(22) PCT Filed: May 28, 1998

(86) PCT No.: PCT/JP98/02360

§ 371 Date: Nov. 24, 1999

§ 102(e) Date: Nov. 24, 1999

(87) PCT Pub. No.: WO98/53738

PCT Pub. Date: Dec. 3, 1998

(30) Foreign Application Priority Data

May 30, 1997 (JP) .............................. 9-142019

(51) Int. Cl.[7] .................................................. G01V 3/00
(52) U.S. Cl. ........................ 324/309; 324/307; 324/322
(58) Field of Search ................................. 324/309, 307, 324/318, 322

(56) References Cited

U.S. PATENT DOCUMENTS 5,406,203 A * 4/1995 Oh et al. ..................... 324/309
5,420,510 A * 5/1995 Fairbanks et al. ........... 324/309
5,751,145 A * 5/1998 Shimizu ...................... 324/309
6,064,203 A * 5/2000 Bottomley ................... 324/309

OTHER PUBLICATIONS

"Magnetic Resonance in Medicine", 34, pp. 293–301, 1995.
"Magnetic Resonance in Medicine", 35, pp. 895–902, 1996.

* cited by examiner

Primary Examiner—Jay Patidar
Assistant Examiner—Brij B. Shrivastav
(74) Attorney, Agent, or Firm—Antonelli, Terry, Stout & Kraus, LLP

(57) ABSTRACT

A plurality of signal acquisition steps 103 to 106 are executed continuously in succession to an inversion longitudinal magnetization generation step 101 for generating inversion magnetization by applying inversion RF pulses to an object. Similar process steps are iterated in another inversion longitudinal magnetization step in a slice non-selecting mode, and the difference is determined between image data acquired by the first signal acquisition steps 103 to 106 and image data acquired by the second signal acquisition steps 107 to 110 to acquire a perfusion image. In this instance, the mode of applying the gradient magnetic field is made different in each signal acquisition step, and images of a plurality of slices are acquired. The process steps described above are iterated while the correspondence relation between an inversion time TI and a selected slice is changed. An image having different inversion times can thus be acquired within a short time for a plurality of slices. Consequently, an image reflecting the time change of perfusion and having a high diagnostic value can be acquired over a broad range.

30 Claims, 9 Drawing Sheets

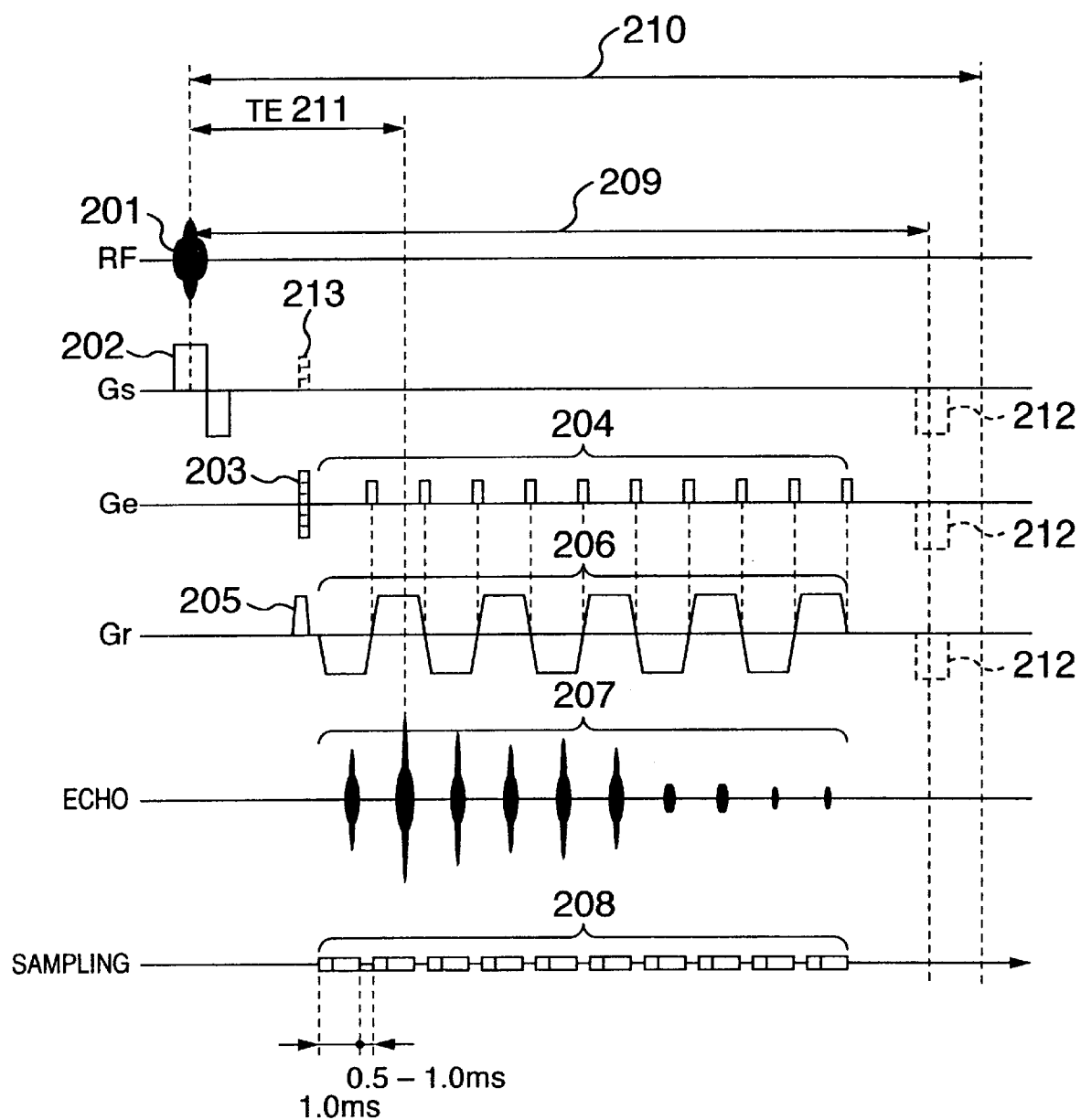

| | TI = 600 | 800 | 1000 | 1200 ms |
|---|---|---|---|---|
| SLICE = 1 | 301 | 302 | 303 | 304 |
| 2 | 304 | 301 | 302 | 303 |
| 3 | 303 | 304 | 301 | 302 |
| 4 | 302 | 303 | 304 | 301 |

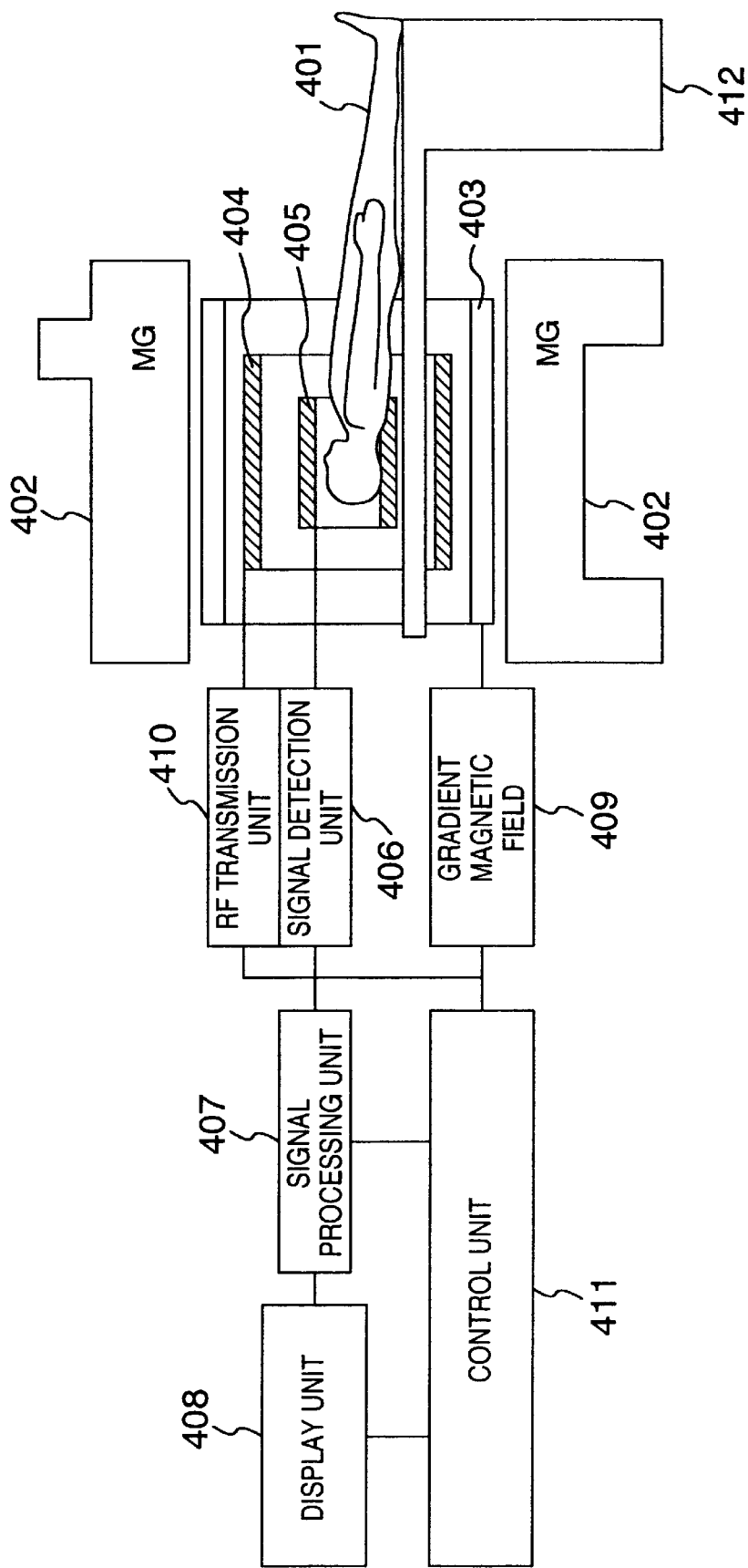

NUCLEAR MAGNETIC RESONANCE IMAGING METHOD AND APPARATUS THEREFOR

TECHNICAL FIELD

This invention relates to a nuclear magnetic resonance imaging (MRI) method for measuring nuclear magnetic resonance (hereinafter referred to as "NMR") signals from hydrogen, phosphorus, and so forth, in an object, and imaging a density distribution of nuclei and a relaxation time. More particularly, the present invention relates to a method of, and an apparatus for, imaging perfusion of distal blood vessels, etc, with high resolution.

BACKGROUND ART

FMRI (Functional MRI) for extracting local activation of the brain from a slight local signal change of time-series MR images has been put into practical application in recent years. A spin tagging method that applies IR (Inversion Recovery) pulses and then executes imaging by EPI (Echo Planar Imaging) sequences has been studied as one of the FMRI, and methods of applying various IR pulses have been examined, too. Such prior art technologies include SG. Kim "Qualification of relative cerebral flow change by flow-sensitive alternating inversion recovery (FAIR) technique: application to functional mapping", Magnetic Resonance in Medicine, 34, pp. 293–301(1995), and SG. Kim et al. "Fast interleaved echo-planar imaging with navigator: high-resolution anatomic and functional images at 4 Tesla", Magnetic Resonance in Medicine, 35, pp. 895–902(1996).

FIG. 9 shows an example of the sequences by the spin tagging method. Initially, an inversion radio frequency pulse (the radio frequency pulse will be hereinafter referred to as the "RF pulse") 901 is applied simultaneously with a slice selecting gradient magnetic field 902. The inversion RF pulse, that is known as an adiabatic inversion RF pulse, is employed as the inversion RF pulse 901 because an accurate rectangular excitation shape can be obtained. A slice becomes thinner when the intensity of the slice selecting gradient magnetic field 902 is higher and becomes thicker when the intensity is lower. When the intensity is zero, that is, when no gradient magnetic field is applied, no slice is selected. A region having a desired thickness can thus be excited selectively (tagging).

After the passage of a predetermined time TI 905 from the end of the application of this inversion RF pulse, an EPI sequence 904 shown in FIG. 2 is executed. In this EPI sequence 904, after the RF pulse 201 is applied simultaneously with the slice selecting gradient magnetic field 202, a phase encode gradient magnetic field 203 is applied in the pulse form so that the application amount is different each time. At the same time, a gradient magnetic field 205 in a readout direction is applied repeatedly and inversely so as to measure echo signals 207. Referring to FIG. 9, a time TI 905 from the end of the application of the inversion RF pulse 901 to the irradiation timing of the RF pulse of an imaging sequence 904 is referred to as a "time of inversion".

In such a spin tagging method, while magnetization of the region selected by the inversion RF pulse is inverted (tagged), spins of bloodstream, etc, migrate from other regions. In consequence, the signals containing the tagged spins and the non-tagged spins in mixture can be acquired in the imaging sequence. Images of perfusion can be acquired by utilizing these signals.

FIG. 10 shows an example of the imaging sequence by applying the spin tagging method to perfusion imaging. This imaging sequence executes once, or iterates continuously, the sequence shown in FIG. 9 in a predetermined repetition time Tr 906. In this instance, the first inversion RF pulse (IR pulse 101) is for slice selection and the second inversion RF pulse (IR pulse 102) is for slice non-selection. The difference of the image data obtained by these two imaging sequences is calculated, and the local perfusion of the brain in the slice selecting region (slice 1) can be imaged. Assuming that the repetition time Tr 906 is 2 seconds and the inversion time TI 905 is 1 second in this case, an about 3-second time is necessary because an ordinary single-shot EPI sequence needs about 100 msec time. One image can be acquired for one slice in the predetermined inversion time.

In the slice selecting RF pulse 903 and imaging (904) of the slice 1 in FIG. 10, the echo signals obtained by imaging are processed by known image processing (such as two-dimensional Fourier transform), giving the image of the slice 1. This image is generally referred to as the "IR (Inversion Recovery) image". It is known that the IR image has various texture contrasts depending on the size of TI. When the artery flows from below to up in the object in this image (for example, the cerebral artery branching from the main artery when the transaxial image of the head is imaged), signals resulting from the bloodstream (perfusion) are imparted to the IR image. In imaging of the slice non-selecting RF pulse and the slice 1 shown in FIG. 10, too, the echo signals obtained by imaging are processed by known image processing (such as two-dimensional Fourier transform), giving the image of the slice 1. This image is also a kind of the IR (Inversion Recovery) images. When the artery flows from below to up in the object, however, the signals resulting from the bloodstream (perfusion) of the blood inverted by the IR pulses are imparted to the IR image. The difference of the data between the first image and this image is calculated, and the signals resulting from the object itself can be removed. Inconsequence, only the signals that depend on the bloodstream (perfusion) are imaged.

In order to obtain this IR image, it has been necessary in the past to apply the IR pulses whenever the slice is changed.

In the spin tagging method described above, the inversion time TI from the end of the application of the inversion RF pulse to the application of the RF pulse of the imaging sequence reflects the regions at which the blood arrives during that period of time. Therefore, when setting of the inversion time TI is changed, the image changes, as well. In perfusion imaging by the existing spin tagging method, imaging is conducted by setting appropriately the inversion time TI (for example, to 0.75 seconds) in accordance with the velocity of the bloodstream to be observed. In order to observe the region of a diseased part having a certain expansion such as the cerebral apoplexy, it is preferred that the TI time can be set in various ways to acquire the images.

It has been required to acquire not only one slice but also multiple slices, or three-dimensional images. When the images each having a various TI time are acquired for the multiple slices, for example, the imaging time of (Tr+TI+EPI imaging time)×(number of TI setting times)×(number of slices) is necessary as the time required for a series of imaging, and the imaging time gets elongated.

DISCLOSURE OF INVENTION

In perfusion imaging by utilizing the spin tagging method, therefore, it is an object of the present invention to provide an MRI method, and an apparatus for the method, that can image the moving condition of a bloodstream, the flow velocity of which changes as it flows towards distal ends, over a broad range, and can acquire multi-slices or three-dimensional images within a short imaging time.

It is another object of the present invention to provide an MRI method, and an apparatus for the method, that can acquire perfusion images with high spatial resolution.

An MRI method according to the present invention for accomplishing the objects described above comprises an inversion longitudinal magnetization generation step for generating inversion longitudinal magnetization by applying radio frequency pulses to an object containing magnetization to be detected, and an imaging step for executing continuously a plurality of signal acquisition steps in succession to the inversion longitudinal magnetization generation step.

Here, the signal acquisition step may comprise a sequence capable of acquiring a plurality of signals by one-time excitation of magnetization, and includes a step for irradiating at least one RF pulse to an object containing magnetization to be detected and generating transverse magnetization in a selected slice, a step for generating a plurality of echo signals by applying gradient magnetic fields to the object having the transverse magnetization applied thereto, and a step for detecting a plurality of echo signals in a time series.

The step for generating a plurality of echo signals and the step for detecting of a plurality of these echo signals in a time series may include, for example, a step for applying readout gradient magnetic pulses, that inverse continuously, to the object to which the transverse magnetization is applied, a step for applying phase encode gradient magnetic fields in synchronism with the readout gradient magnetic field pulses, and a step for detecting a plurality of echo signals generated in each cycle of the inverting readout gradient magnetic fields in a time series (EPI: Echo Planar Imaging). The step for generating the transverse magnetization may be the one that irradiates a plurality of RF pulses, irradiates further second RF pulses for inverting the phase of the transverse magnetization, and acquires the same number of echo signals as the number of a plurality of RF pulses (burst sequence). The signal acquisition step, in particular, is most appropriately the one that irradiates a plurality of RF pulses while a gradient magnetic field in a readout direction is being applied, then irradiates 180° RF pulse (for inverting the phase of the transverse magnetization) while a slice selecting gradient magnetic field is being applied, generates serially the same number of sets of echo signals as the number of RF pulses while the gradient magnetic field in the readout direction is being inverted, applies in this instance a different phase encode gradient magnetic pulse whenever the gradient magnetic field inverts, and detects a plurality of sets of echo signals in a time series (hybrid burst sequence).

In the first embodiment of the present invention, mutually different slice positions are selected and signals are acquired by a plurality of signal acquisition steps that are executed in succession to the inversion longitudinal magnetization generation step. In an embodiment of the present invention that is particularly preferred, a plurality of sets, each of which comprises the inversion longitudinal magnetization generation step and an imaging step including a plurality of signal acquisition steps, are iterated, and in the iteration of such sets, the slice position for selecting a plurality of signal acquisition steps is serially changed.

In this way, a plurality of images each having a different inversion time TI from the end of the inversion longitudinal magnetization generation step to the irradiation of the RF pulse in each signal acquisition step can be acquired within an extremely short period of time for a plurality of slices. Consequently, the change of the bloodstream can be observed over a broad range.

In the second embodiment of the present invention, the same slice position is selected in a plurality of signal acquisition steps, and a plurality of images each having a different inversion time TI from the end of the inversion longitudinal magnetization generation step to the irradiation of the radio frequency pulses in each signal acquisition step are acquired. In this case, the change of the bloodstream can be observed with high time resolution.

In this second embodiment, too, the signal acquisition step may be the method that can acquire a plurality of signals by one-time excitation of magnetization. For example, EPI, a burst sequence or a hybrid sequence, can be employed. Furthermore, it is possible to employ a method that acquires the signals to which a different phase encode gradient magnetic field is applied in each signal acquisition step (split EPI or multi-shot EPI, burst, etc). In this case, one image can be re-constructed by a plurality of signal acquisition steps. Therefore, an image having high spatial resolution can be acquired.

The third embodiment of the present invention employs three-dimensional imaging for a plurality of signal acquisition steps. The signal acquisition steps in this case include a step of irradiating at least one RF pulse to an object containing magnetization to be detected and generating transverse magnetization, a step of applying a slice encode gradient magnetic field to the object to which transverse magnetization is applied, a step of applying mutually different phase encode gradient magnetic fields to the object to which transverse magnetization is applied, and generating a plurality of echo signals, and a step of detecting a plurality of echo signals in a time series. Means for acquiring a plurality of signals applies mutually different slice encode gradient magnetic fields and acquires the signals.

This embodiment can acquire an image having higher spatial resolution than multi-slice imaging in the first and second embodiments that executes the MRI method for a plurality of slices. However, the inversion time TI of the image obtained in this case is a mean value of the inversion time TIs of a plurality of signal acquisition steps.

The MRI method and apparatus according to the present invention can acquire within a short time the images reflecting the time change of perfusion over a relatively broad range and having high diagnostic value by executing continuously a plurality of signal acquisition steps in succession to inversion magnetization generation in perfusion imaging by spin tagging.

Because the MRI method and apparatus according to the present invention can continuously image the images each having a different inversion time, they can image the perfusion both spatially and time-wise. Particularly when the images each having a different inversion time is acquired, the images having different inversion time can be imaged continuously for a plurality of slices within an extremely short time by serially changing the correspondence relation between the slice to be selected and the inversion time.

The number of slices, the number of kinds of inversion time TI and spatial resolution can be increased within the same signal acquisition time by using an ultra-high speed burst sequence that comprises the combination of a plurality of RF excitation pulses and inversion gradient magnetic fields as the signal acquisition steps. Therefore, the perfusion in a broader region can be observed with higher time and spatial resolution. Consequently, the present invention can provide the images having higher diagnostic value for blood vessel diseases having the lesions in a broader range, such as the cerebral apoplexy.

BRIEF DESCRIPTION OF DRAWINGS

FIG. 2 is a timing chart of an EPI sequence employed in an MRI method of the present invention.

FIG. 4 is a block diagram of an MRI apparatus to which the present invention is applied.

BEST MODE FOR CARRYING OUT THE INVENTION

Figure 1A:
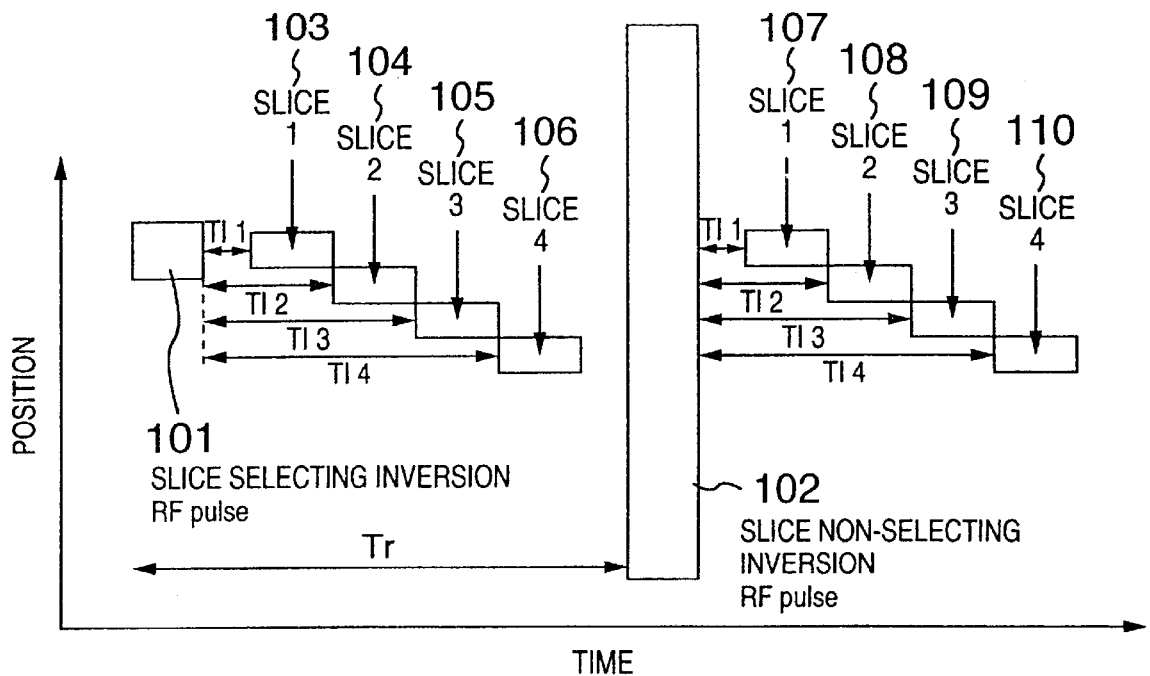
FIG. 1A shows an embodiment of the present invention.

Hereinafter, embodiments of the present invention will be explained with reference to the drawings.

FIG. 4 shows the construction of a typical MRI apparatus to which an MRI method according to the present invention is applied. This MRI apparatus includes a magnet 402 that generates a uniform static magnetic field in a measurement space in which an object 401 is placed, a gradient magnetic field coil 403 for generating a gradient magnetic field in this space, an RF coil 404 for generating an RF magnetic field in the space and an RF probe 405 for detecting MR signals generated by the object 401. Abed 412 is provided in order for the object 412 to lie down on.

The gradient magnetic field 403 comprises gradient magnetic field coils in X, Y and Z three directions, each generating a gradient magnetic field in accordance with a signal from a gradient magnetic field power source 409. A gradient magnetic field in a predetermined direction is applied to a static magnetic field in superposition with the latter so that spins can be selectively excited in a desired region (a slice or a slab which is a thicker region than the slice) of the object 401.

The RF coil 404 generates an RF magnetic field in accordance with the signals from an RF transmission unit 410. This RF transmission unit 410 overlaps a predetermined envelope signal with a carrier wave having a predetermined frequency. In this way, an adiabatic inversion RF pulse used in the present invention for generating inversion longitudinal magnetization and an RF pulse (excitation pulse) for generating transverse magnetization in an image process can be generated.

MR signals induced in the RF envelope 405 are detected by a signal detection unit 406 and are processed by a signal processing unit 407. They are further converted to image signals by calculation. The image is displayed on a display unit 408. Each of the gradient magnetic filed power source 409, the RF transmission unit 410 and the signal detection unit 406 is controlled by a control unit 411. The time charts of these gradient magnetic field, RF magnetic field and signal detection that are controlled by this control unit 411 are generally referred to as a "pulse sequence". In the present invention, a pulse sequence comprising the combination of an inversion longitudinal magnetization generation step and an imaging step comprising a plurality of signal acquisition steps is executed as will be explained next.

FIG. 1A shows an embodiment of the MRI method according to the present invention. Each step executed in this MRI method is arranged along the time axis (abscissa). The ordinate represents a slice position of the object that is excited in each step. This MRI method executes, in time intervals Tr, an inversion longitudinal magnetization generation step for selectively inverting longitudinal magnetization of a predetermined region of the object, that is, a slice selecting IR pulse application step 101, a first sequence comprising four signal acquisition steps 103 to 106 that are executed continuously in succession to the inversion longitudinal magnetization generation step 101, an inversion longitudinal magnetization step for inverting non-selectively longitudinal magnetization of all the regions of the object, that is, a slice non-selecting IR pulse application step 102, and a second sequence comprising four signal acquisition steps 107 to 110 that are executed continuously in succession to the inversion longitudinal magnetization generation step 102. When a read step is a single-shot EPI, the set of the first and second sequences may be one, but the process is iterated the number of times corresponding to the number of shots in multi-shot EPI.

Figure 9:
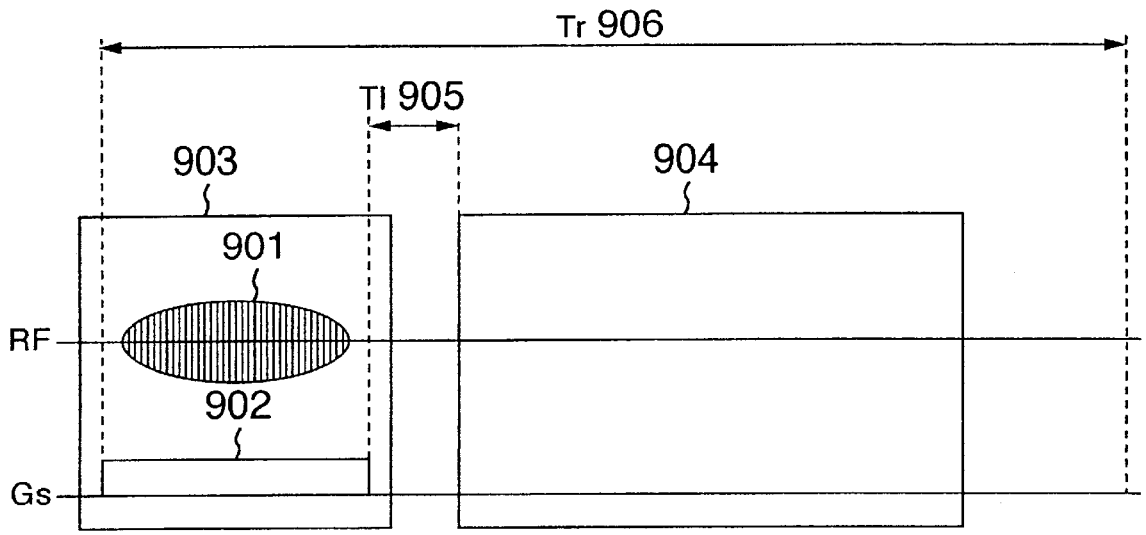
FIG. 9 shows an example of an imaging sequence according to the prior art.
Figure 10:
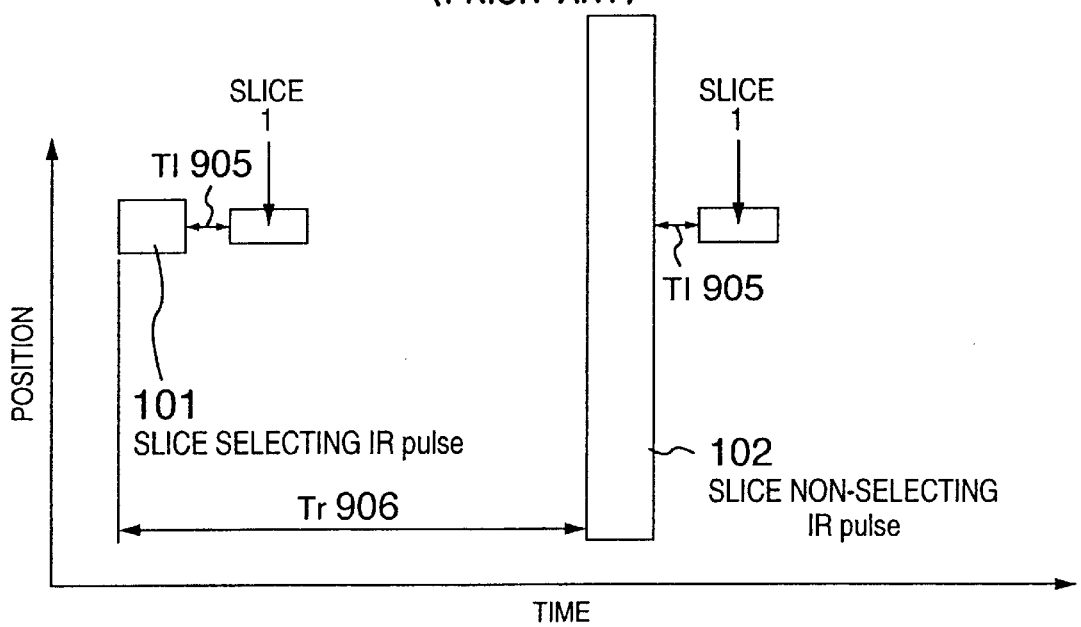
FIG. 10 shows another example of the imaging sequence according to the prior art.

The first inversion longitudinal magnetization step 101 comprises an inversion RF pulse 901 shown in FIG. 9 and a slice selecting gradient magnetic field pulse 902 that is applied simultaneously with the former. An adiabatic inversion RF pulse capable of providing an accurate rectangular excitation shape is used as the inversion RF pulse 901. The gradient magnetic field pulse 902 that is applied simultaneously with the adiabatic RF pulse has an intensity such that the region including all the slices selected by each signal acquisition step to be executed in succession can be selected. The imaging section is transaxial and the slice thickness is 10 mm, for example.

After the passage of a predetermined time TI1 from the end of the application of this inversion RF pulse, the first signal acquisition step 103 is executed. Subsequently, the second to fourth signal acquisition steps 104 to 106 are executed. In this embodiment, the signal acquisition steps 103 to 110 comprise a sequence for acquiring a plurality of signals necessary for reconstructing one image by one-time excitation, and execute the single-shot EPI sequence shown in FIG. 2, for example.

In other words, the RF pulse 201 is irradiated to the object containing magnetization to be detected and at the same time, the gradient magnetic field pulse 202 for selecting the slice is applied. In consequence, the slice to be imaged is selected. Next, a pulse 203 for providing offset of phase encoding and a pulse 205 for providing offset of a read gradient magnetic field are applied. A read gradient magnetic field pulse 206 that inverts continuously is then applied. The gradient magnetic field pulse 206 is a trapezoidal pulse, for example. A phase encoding gradient magnetic field pulse 204 is applied discretely in synchronism with the gradient magnetic field pulse 206. Echo signals 207 of each phase encoding are generated in time series within each cycle of the inverting read gradient magnetic field 206. The echo signals are sampled within the time range 208 to obtain time series data. The image is reconstructed from each echo signal so acquired, and image data of 64×64 pixels, for example, is acquired. The time range of individual A/D windows of sampling 208 is typically about 1 ms, and the adjacent gap of the A/D windows is from about 0.5 to about 1 ms. All the echoes necessary for the image reconstruction are collected by a series of operations 209.

The section to be imaged is decided by the gradient magnetic field 202 in the slice direction. In this case, the slice selected by each signal acquisition step is a part of the region selected by the inversion longitudinal magnetization generation step 101, and mutually different slices (slice 1 to slice 4) are selected serially in the signal acquisition steps 103 to 106. Assuming that the slice thickness is 2.5 mm and the slice gap is 0 mm, for example, in each signal acquisition step in the inversion longitudinal magnetization generation step 101, the images of the four different slices can be acquired.

In the case of the EPI sequence described above, the echo time TE 211 of each signal acquisition step is 10 ms and the length of an echo train 207 (for acquiring a plurality of echo signals) is 100 ms, for example. The signal acquisition step can be iterated in the cycle of the sum of about 10 ms+100 ms+ wait time, and the images of different inversion time TI can be acquired. In the example shown in the drawings, the inversion time TI1 of the first slice is 600 ms, TI2=800 ms for the second slice, TI3=1,000 ms and TI4=1,200 ms. The iteration time Tr is 2,000 ms. This embodiment can acquire four slices in 1,200 ms and four kinds of TI images.

The second inversion longitudinal magnetization generation step 102 is the same as the first inversion longitudinal magnetization generation step 101 with the exception that the slice selecting gradient magnetic field pulse (902 in FIG. 9) is not used. The adiabatic inversion RF pulse is applied under the slice non-selecting state. The subsequent signal acquisition steps 107 to 110 are exactly the same as the signal acquisition steps 103 to 106 described above, serially select a part of the slices (slice 1 to slice 4) of the region selected by the first inversion longitudinal magnetization generation step 101, and acquire four image data having different inversion time and the slices by the EPI sequence.

Figure 1B:
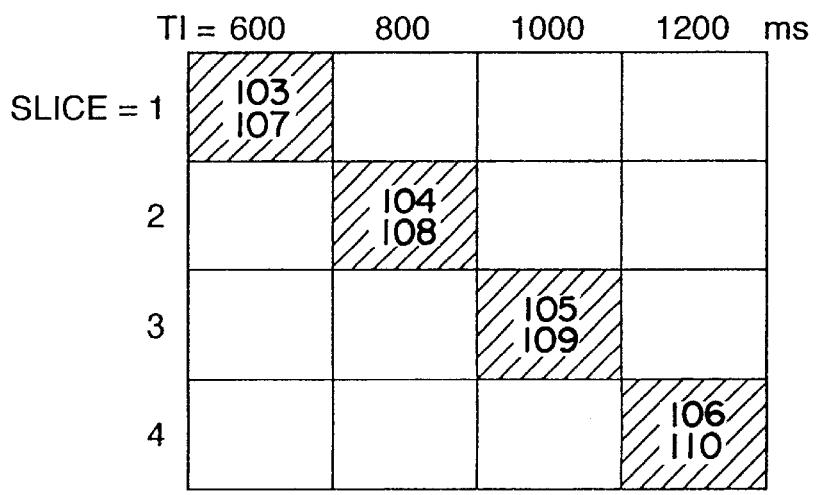
FIG. 1B shows image data obtained in an imaging step of FIG. 1A.

Hatched portions in FIG. 1B show the image data acquired by the signal acquisition steps 103 to 106 and 107 to 110.

In this embodiment, the magnetization excited by the RF irradiation in each signal acquisition step (imaging step) is contained in each mutually different slice. In other words, RF irradiation of the slice 1 does not excite magnetization of the slice 2. In consequence, even when the step 104 is executed in succession to the step 103, saturation of longitudinal magnetization does not occur during imaging of the slice 2, and the drop of the signal quantity, that is, deterioration of image quality, does not occur, either. Consequently, each signal acquisition step can be executed continuously within a short iteration time. Though the drawing shows the case where four slice images are acquired, the signal acquisition process of a greater number of steps (e.g. 8 steps) can be executed within the time interval Tr.

As described above, the difference between the data of the same slice is determined in the image data acquired by the first and second sequences and by so doing, the image for each slice can be obtained.

In other words, imaging 103 provides the image of the slice 1 in the inversion time TI1 in FIG. 1A, and imaging 104 provides the image of the slice 2 of the inversion time TI2. Imaging 105 provides the image of the slice 3 of the inversion time TI3 and imaging 106, the image of the slice 4 of the inversion time TI4. The signals that reflect the bloodstream (perfusion) from the cerebral artery and are inverted by the IR pulse, are imparted to these images, respectively. Imaging 107 gives the image of the slice 1 of the inversion time TI1 and imaging 108 gives the image of the slice 1 of the inversion time TI2. Imaging 109 gives the image of the slice 3 of the inversion time TI3 and imaging 110 gives the image of the slice 4 of the inversion time TI4. The signals that reflect the bloodstream (perfusion) from the cerebral artery inverted by the IR pulses are imparted to these images, respectively.

The image reflecting the bloodstream (perfusion) is acquired for each of these images. The bloodstream (perfusion) information can be selectively imaged by conducting the following process. When the image acquired by imaging 107 is subtracted from the image acquired by imaging 103, the difference of the signal of the object itself is acquired, and only the bloodstream (perfusion) information of the slice 1 at TI1 can be acquired. When the image acquired by imaging 108 is subtracted from the image acquired by imaging 104, the difference of the signal of the object itself is acquired, and only the bloodstream (perfusion) information of the slice 2 at TI2 can be acquired. When the image acquired by imaging 109 is subtracted from the image acquired by imaging 105, the difference of the signal of the object itself is acquired, and only the bloodstream (perfusion) information of the slice 3 at TI3 can be acquired. When the image acquired by imaging 110 is subtracted from imaging 106, the difference of the signal of the object itself is acquired, and only the bloodstream (perfusion) information of the slice 4 at TI4 can be acquired.

As described above, the embodiment shown in FIG. 1A can acquire a plurality of slice images each a having different inversion time within a short time.

Figures 3A, 3B:
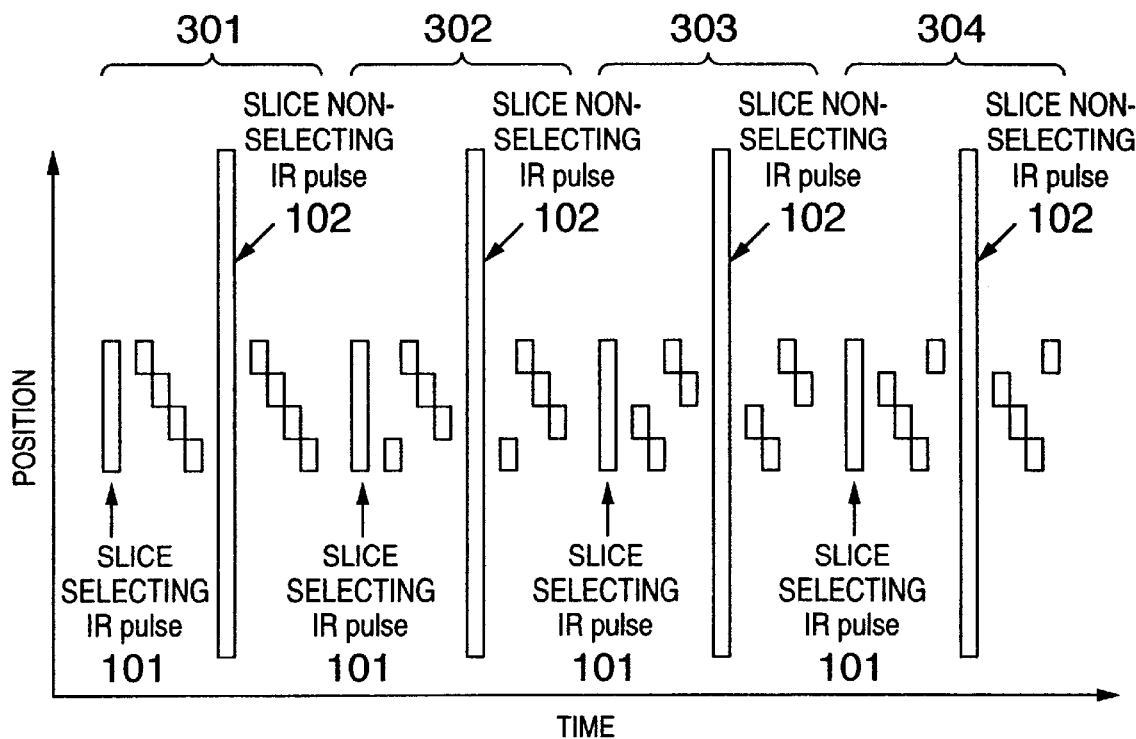
FIG. 3A shows an embodiment of the present invention.
FIG. 3B shows an image obtained by an imaging step of FIG. 3A.

Next, a method of acquiring images each having a mutually different inversion time for a plurality of slice images will be explained as an embodiment that applies the MRI method shown in FIG. 1A. As shown in FIG. 3A, this method iterates a plurality of sets (four sets, in the drawing) of sequences 301 to 304 with the sequences shown in FIG. 1A forming one set. In other words, the first set of sequence 301 comprises an inversion longitudinal magnetization generation step 101 that selects a slice, a plurality (four, in this case) of signal acquisition steps 103 to 106 subsequent to the step 101, a slice non-selecting inversion longitudinal magnetization generation step 102, and a plurality of signal acquisition steps 107 to 110 subsequent to the step 102. These inversion longitudinal magnetization generation steps 101, 102 and signal acquisition steps 103 to 110 are the same as those of the embodiment explained with reference to FIG. 1A. The difference between the data acquired by the imaging step subsequent to the slice selecting inversion longitudinal magnetization generation step 101 and the data acquired by the imaging step subsequent to the slice non-selecting inversion longitudinal magnetization generation step 102 is likewise calculated for each slice.

In this embodiment, however, the sequence of slice selection in the signal acquisition steps is different between the sets of sequences, and imaging is conducted in such a fashion that the relation of correspondence between the inversion time and the selected slice becomes different. Namely, the slices 1 to 4 are selected serially in the signal acquisition steps 103 to 106 (107 to 110) in the first imaging step 301. In the second imaging step 302, however, the slice 4, next the slice 1, and then the slice 2, and finally the slice 3, are selected in the first signal acquisition step. In the third imaging step 303, the slices are selected in the order of the slice 3, the slice 4, the slice 1 and the slice 2. In the fourth imaging step 304, the slices are selected in the order of the slice 2, the slice 3, the slice 4 and the slice 1. Consequently, four images having mutually different inversion times can be acquired for the four slices at the end of the fourth imaging step 304.

FIG. 3B shows the relationship between the slice position of the image acquired by each imaging step 301 to 304 and the inversion time.

If the time interval Tr is 2,000 ms, this embodiment can acquire 16 images in total for four slices in 8×Tr=16 seconds. In this way, the images reflecting the moving condition of the bloodstream over a broad range can be acquired within an extremely short time. Therefore, those images which are very useful for the diagnosis of the disease, that generates the change in the bloodstream in a broad range and has an expansion, such as the cerebral apoplexy, can be provided.

Each image comprising the combination of TI and the slice position contains the slice selecting TI image and the slice non-selecting TI image. The image that emphasizes the bloodstream (perfusion) information can be acquired by conducting the following operation for 4×4×2=32 images.

(1) Slice difference is conducted for each of TI=600 ms, the slice 1, slice selection and slice non-selection, and the bloodstream (perfusion) image of TI=600 ms and the slice 1 can be acquired. This also holds true of other TI values and the slice number.

(2) When the difference is calculated between the images obtained in different TI (for example, TI=800 and 1,000) and in the same slice (for example, the slice 1) among the images obtained in (1), the images reflecting the perfusion state in the slice 1 and in 200 ms can be acquired. These images can grasp the perfusion further precisely.

The above explains a plurality of signal acquisition steps subsequent to the inversion longitudinal magnetization generation step about the embodiment (first embodiment) for acquiring the signals by making the selecting slices different. However, the MRI method according to the present invention may be executed by selecting the same slice for a plurality of signal acquisition steps. Next, another embodiment (second embodiment) of the invention for executing a plurality of signal acquisition steps for the same slice will be explained.

Figure 5:
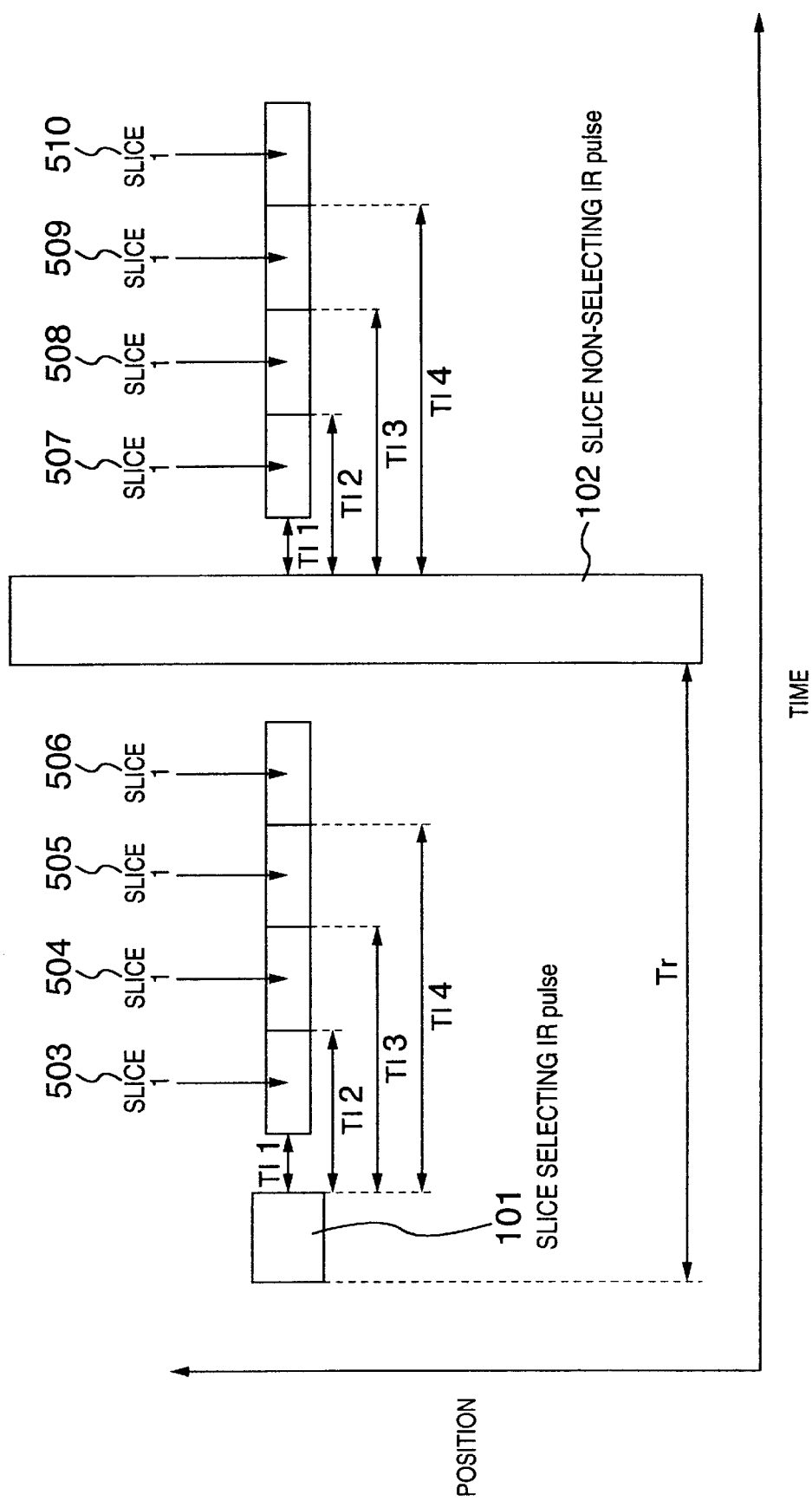
FIG. 5 shows another embodiment of the present invention.

The MRI method of the embodiment shown in FIG. 5 comprises the inversion longitudinal magnetization generation step 101 that selects the slice, a plurality (four, in this embodiment) of signal acquisition steps 503 to 506 subsequent to the step 101, a slice non-selecting inversion longitudinal magnetization generation step 102 and a plurality of subsequent signal acquisition steps 507 to 510. Each of the signal acquisition steps executes single-shot EPI 503 to 510 such as the one shown in FIG. 2 in the same way as in the embodiment shown in FIG. 1A. The difference of this embodiment from the embodiment shown in FIG. 1A is that each signal acquisition step images the same slice. Therefore, the slice selected in the inversion longitudinal magnetization generation step 101 is the same as the slice that is selected in the subsequent signal acquisition steps, or as the slice that contains the former.

In this embodiment, the same slice is excited consecutively. Therefore, the RF pulse applied in each EPI sequence is preferably smaller than 90 degrees. A de-phase pulse 212 (represented by dotted line in FIG. 2) is applied, whenever necessary, to the last part of each EPI sequence in order to remove the influences of the gradient magnetic field pulses applied during the process steps.

The difference is calculated between the image data acquired from the echo signals given by the EPI sequences 503 to 506 and the image data acquired from the echo signals given by the EPI sequences 507 to 510 for each different inversion time TI. In this way, a plurality of images each having a different inversion time can be acquired consecutively for the same slice. The images each having a different inversion time reflect the moving region of the bloodstream as has already been described. Therefore, this embodiment can image the mode of the movement of the bloodstream inside the same slice within a short time. To acquire the images for the multiple slices, the sequence shown in FIG. 5 is iterated while the slices to be selected are being changed.

In comparison with the embodiment shown in FIG. 1A, this embodiment involves the case where the signal quantity drops because relaxation of longitudinal magnetization is not entirely complete. None the less, this embodiment can acquire the images each having a different inversion time for the same slice, can shorten the imaging time and can improve time resolution in comparison with the prior art methods.

Figure 6:
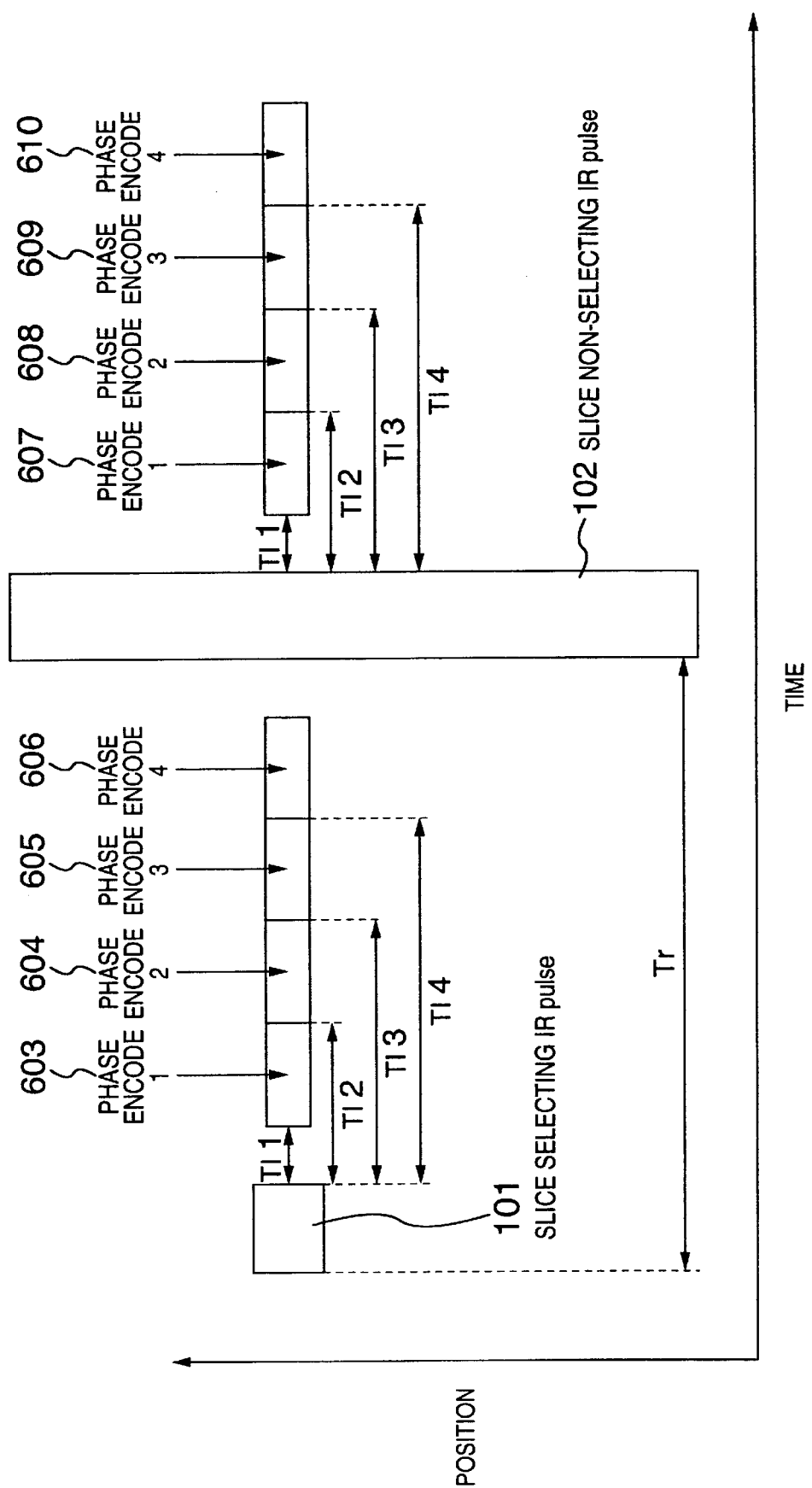
FIG. 6 shows still another embodiment of the present invention.

Each signal acquisition step in this embodiment executes single-short EPI and acquires the image having mutually different inversion time. However, a single image may be acquired by a plurality of signal acquisition steps by executing multi-shot EPI in these signal acquisition steps. Such an embodiment is shown in FIG. 6. In this embodiment, the individual signal acquisition steps 603 to 610 execute a split type EPI.

In the operation of EPI shown in FIG. 2, the split type EPI acquires only a part of the phase encode data, iterates the operation 209 while the pulse 203 that provides the offset of the phase encode (represented by the dotted line in the drawing) is changed, and acquires the remaining echo signals 207. Referring to FIG. 6, the same slice is selected in the continuous signal acquisition steps 603 to 606. While the phase encode pulses 203 are serially changed, the split type EPI is executed to acquire the echo signals by the different phase encodes. Finally, the echo signals necessary for reconstructing one image for the slice 1 are acquired by the four signal acquisition steps. Incidentally, the RF pulse of each EPI is made smaller than 90 degrees, and a crusher pulse or a de-phase pulse 212 is added after the operation 209, whenever necessary.

In FIG. 6, the imaging step 603 acquires ¼ of the echoes necessary for the image acquisition from the echoes acquired by the IR sequence of the inversion time TI1. This will be called the "phase encode 1". The imaging step 604 acquires ²⁄₄ of the echoes necessary for the image acquisition from the echoes acquired by the IR sequence of the inversion time TI1. This will be called the "phase encode 2". The imaging step 605 acquires ¾ of the echoes necessary for the image acquisition from the echoes acquired by the IR sequence of the inversion time TI1. This will be called the "phase encode 3". The imaging step 606 acquires ⁴⁄₄ of the echoes necessary for the image acquisition from the echoes acquired by the IR sequence of the inversion time TI1. This will be called the "phase encode 4". These phase encodes 1 to 4 are transformed by a known signal processing (two-dimensional Fourier transform) and give the image of the mean TI. Here, the mean TI is given approximately by (TI1+TI2+TI3+TI4)/4.

The signal acquisition steps 607 to 610 of the latter half also execute the split type EPI. The difference is calculated between the image data acquired at this time and the image data acquired by the signal acquisition steps 603 to 606 of the former half.

The number of echoes acquired in the operation 209 of the EPI sequence shown in FIG. 2 becomes smaller in the split type (multi-shot type) EPI than in the single-shot EPI. Therefore, the time of one signal acquisition step becomes 209 shorter. As a result, the drop of the echo signals in the latter half of the operation 209 becomes smaller, and the images having higher quality can be acquired. Since the quantity of the phase encodes becomes greater (twice) in comparison with the embodiment shown in FIG. 5, the images having higher spatial resolution can be acquired. In the embodiment (multi-shot EPI) shown in FIG. 6, however, the inversion time TI has an effective TI which is the mean of the inversion time TI1 to TI4 of each signal acquisition step.

Figure 7:
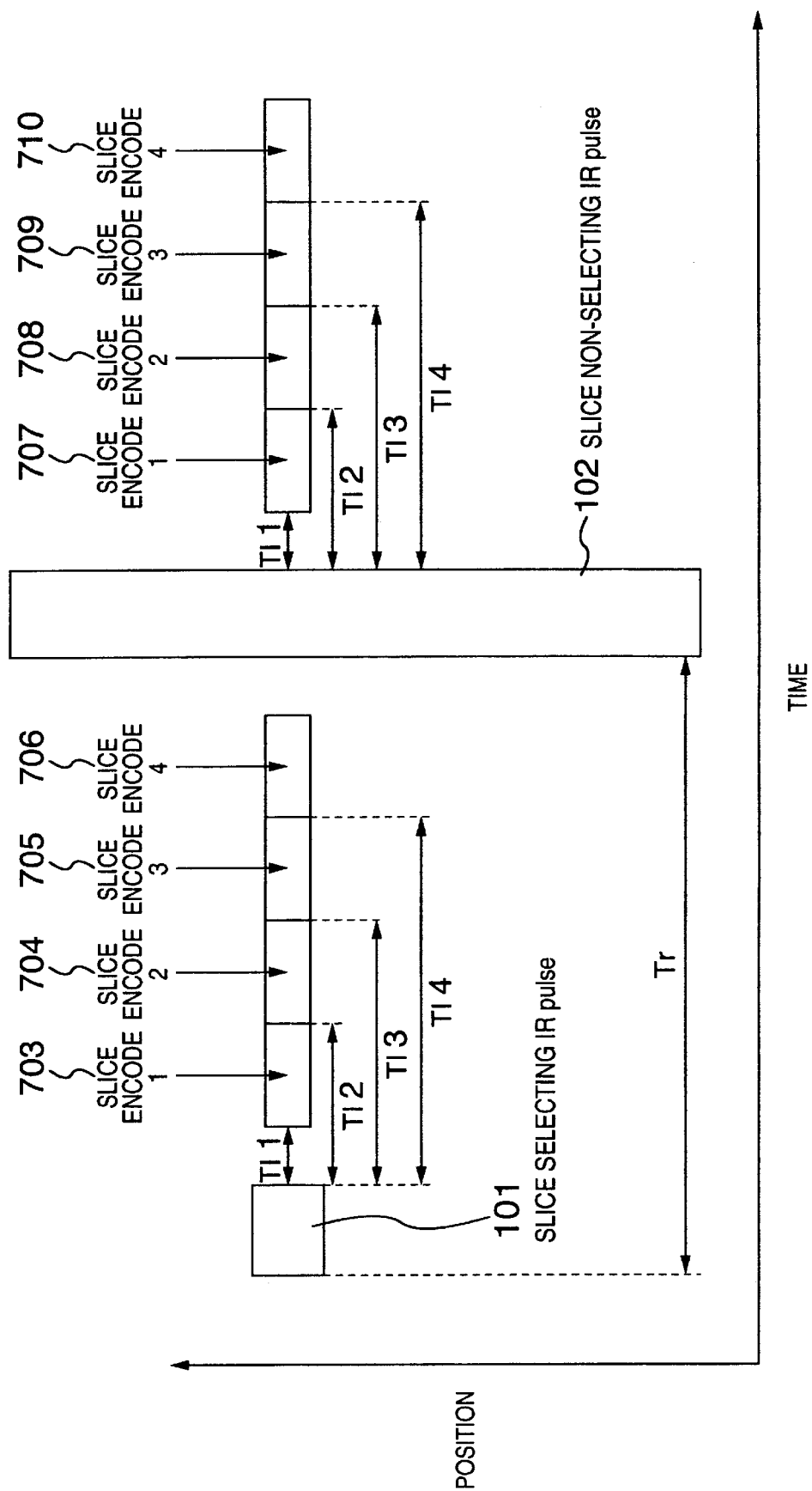
FIG. 7 shows still another embodiment of the present invention.

Next, the embodiment wherein the present invention is applied to a three-dimensional imaging sequence will be explained as still another embodiment (third embodiment) of the present invention. As shown in FIG. 7, this embodiment comprises a slice selecting inversion longitudinal magnetization generation step 101, a slice non-selecting inversion longitudinal magnetization generation step 102 and a plurality (four, in this case) of subsequent signal acquisition steps 703 to 706, and 707 to 710. The signal acquisition steps 703 to 710 are three-dimensional EPI for imaging the same slab (thick slice). In the EPI sequence shown in FIG. 2, the three-dimensional EPI selects the slabs by the slice gradient magnetic field 202 applied simultaneously with the RF pulse 201, adds the slice encode pulse 213 represented by the dotted line, and iterates the operation that is executed within the time 209 while the slice encode pulse 213 is changed for each RF pulse 201. A crusher pulse 212 may be added, whenever necessary.

In the embodiment shown in FIG. 7, each of the signal acquisition steps applies a different slice encode gradient magnetic field (slice encode 1 to slice encode 4) and acquires the signal. In this case, too, the RF pulse of each EPI is smaller than 90 degrees, and a de-phase pulse is preferably added to the last part of each EPI, whenever necessary. The difference is calculated between the three-dimensional image data from the signals acquired by the former half signal acquisition steps 703 to 706 and the three-dimensional image data from the signals acquired by the latter half signal acquisition steps 707 to 710. The three-dimensional image is reconstructed in this way. The inversion time TI of this image is the mean of the inversion time TI1 to TI4 of each signal acquisition means.

This embodiment iterates the excitation of the same slab in the same way as in the embodiment (iteration of the single-shot EPI) shown in FIG. 5. Therefore, the signal quantity drops in some cases because the relaxation of longitudinal magnetization is not complete. However, this embodiment has the merit that spatial resolution in the slice direction becomes higher than the multi-slice single-shot EPI that iterates the sequence of FIG. 5 by changing the selecting slice. It has also the merit that image quality can be improved.

The MRI method according to the present invention has thus been explained about the case 1) where different slices are selected by a plurality of signal acquisition steps (FIGS. 1A and 3A), and the case 2) where the same slice or slab is selected (FIGS. 5 to 7). In these cases, the single-shot or split type EPI is executed by the signal acquisition steps of each embodiment. However, other sequences of EPI may be employed as the signal acquisition sequence. For example, a sequence referred to as a "burst sequence" using a plurality of RF pulses as the excitation pulse, and a "hybrid burst sequence" comprising the combination of this burst sequence with the inversion of the gradient magnetic field, can be employed, too.

Figure 8:
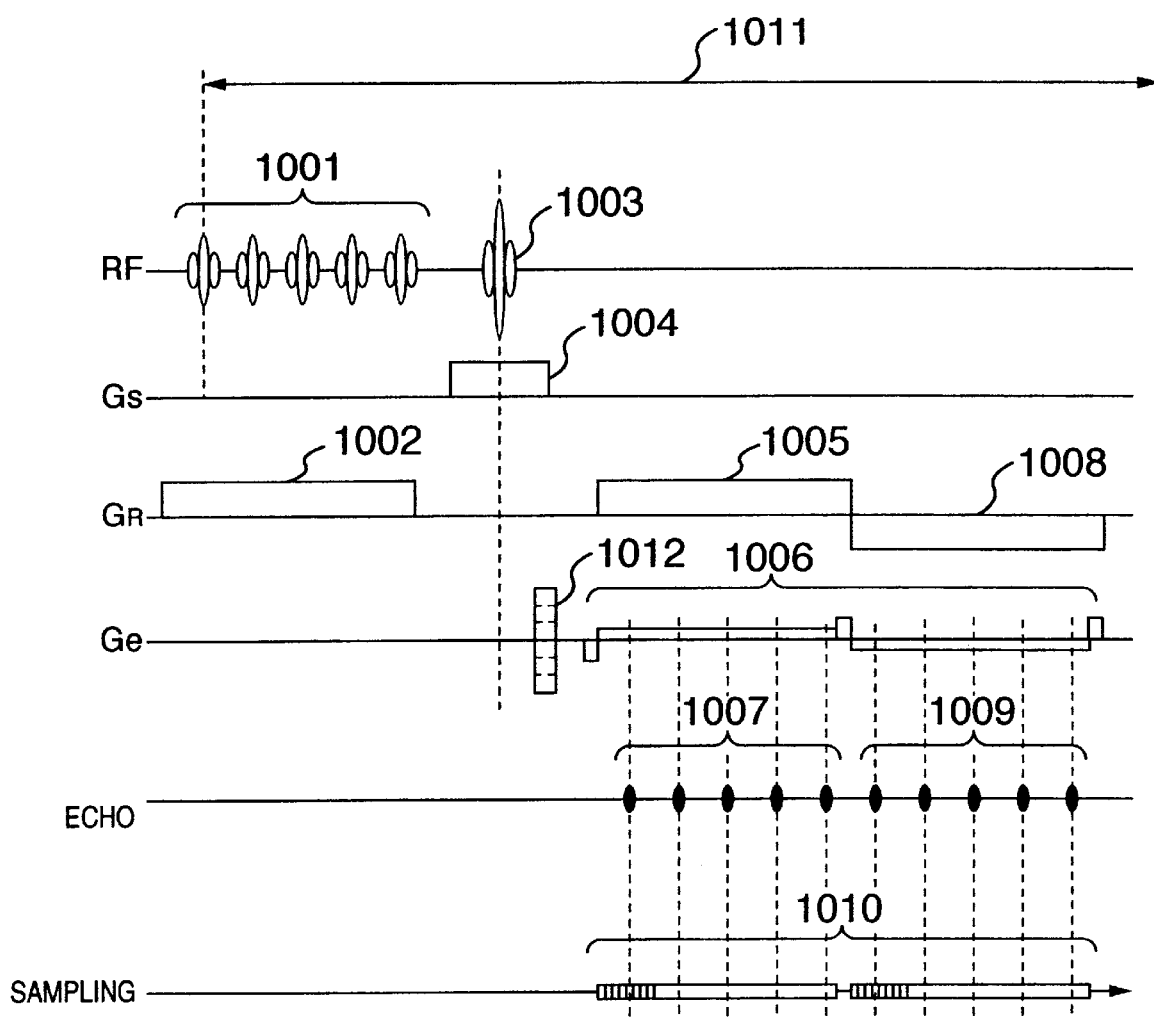
FIG. 8 is a timing chart of a hybrid burst sequence employed in the MRI method of the present invention.

FIG. 8 shows an example of the hybridburst sequence. In this sequence, a plurality (five, in FIG. 8) of RF pulses 1001 are irradiated continuously while a readout pulse 1002 is being applied. Next, a 180° RF pulse 1003 is irradiated while a slice gradient magnetic field 1004 is being applied. When a readout pulse 1005 having the same shape as the readout pulse 1002 is irradiated, the same number of echoes 1007 as the number of irradiated RF pulses 1001 develop. A phase encode pulse 1006 is applied in synchronism with collection of the echoes. When inversion readout pulses 1008 are applied subsequently, the same number of echoes 1009 further develop. Data sampling 1010 is executed in match with the echoes.

The burst sequence generates a plurality of echoes by the continuous RF pulses unlike the EPI. Therefore, it can collect the signals within a short time. Particularly because the hybrid burst sequence shown in the drawing partly uses the inversion gradient magnetic field, too, it can further shorten the imaging time 1011 in comparison with the EPI. A typical imaging time is 20 to 40 ms.

In the example shown in the drawing, the inversion gradient magnetic fields (1005 and 1008) constitute one set. In order to increase the number of phase encodes, however, the inversion magnetic fields may be iterated continuously such as eight times. In this way, the echo signals necessary for one image can be acquired by executing once the sequence in the same way as the single-shot EPI. Such a hybrid burst sequence can be employed as the sequence of the signal acquisition steps of the embodiments shown in FIGS. 1A, 3A, 5 and 7. Moreover, because the imaging time is as fast as 20 ms, a greater number of TI images and a greater number of multi-slice images can be acquired.

For, in the case of the perfusion measurement, the TI range of from about 800 ms to about 1,200 ms is believed clinically significant. If the time necessary for the imaging process is short as in burst imaging, a greater number of images can be acquired within a given time. This increment may be utilized for increasing the number of setting of TI, for example. In this case, the time change of perfusion can be imaged in detail. It may also be utilized for increasing the number of slices. In this case, the spatial distribution of the perfusion in the slice direction can be imaged in detail.

Incidentally, when the hybrid burst sequence is applied to three-dimensional imaging shown in FIG. 7, the slice gradient magnetic field 1004 is utilized as the slab selecting gradient magnetic field, and then the slice encode pulses are added. The signal acquisition steps are iterated while the slice encode pulses are being changed.

The hybrid burst sequence shown in FIG. 8 may be converted to the multi-shot sequence by combining a plurality of times the series of operations executed in the time 1011 in order to increase the number of phase encodes. The number of iteration of the operations is four, for example, and each operation acquires ten echoes (1007 and 1009). The operations of four times acquire 40 echoes in total, or all the echo signals necessary for reconstructing one image. A known technology is employed for converting the signals to the image. For example, data of relatively low phase encodes are collected by 40 echoes described above, and data of high phase encodes are substituted by zero. The sampling number of A/D conversion of each echo is 128, for example. The image is generated by two-dimensional Fourier transform of the 60×128 data matrix so prepared. Both ends in the data sampling direction are cut off, and the 64×64 images can be acquired.

The sequence converted to the multi-shot sequence as described above acquires the echoes to which the different phase encode is added for each shot. Therefore, additional pulses other than those shown in FIG. 8 are necessary for the phase encode gradient magnetic field Ge. This corresponds to the case where the application area (intensity×time) of the pulse 203 applied for achieving the multi-shot sequence in the echo planar sequence (FIG. 2) is changed for each shot. In other words, a pulse (1012), the application area (intensity×time) of which is changed for each shot, is added before the application of the phase encode pulse 1006 in FIG. 8.

Such a multi-shot hybrid sequence can be employed as the sequence of the signal acquisition steps of the embodiment shown in FIG. 6. The individual signal acquisition steps 603 to 606 correspond to a series of the operations executed within the time 1011 of the hybrid burst sequence, respectively.

When the burst sequence, particularly the hybrid burst sequence, is employed as the sequence of the signal acquisition steps of the present invention, the imaging time is as fast as 20 ms. Therefore, a greater number of TI images and a greater number of multi-slice images can be acquired than when the EPI sequence is employed.

The present invention can acquire the IR images of different slices by applying once the IR pulse. The sizes of the region for generating inversion longitudinal magnetization may be mutually different in the application of the slice selecting IR pulses and in the slice non-selecting IR pulses. These regions may overlap with one another at least partially, or may be entirely different regions.

The application of the slice selecting IR pulses is made before the application of the slice non-selecting IR pulses in each of the foregoing embodiments, but this order may be reversed.

The present invention is not particularly limited to the embodiments given above but includes various changes and modifications within the scope of the appended claims.

What is claimed is:

1. A nuclear magnetic resonance imaging method including a first inversion longitudinal magnetization generation step for generating inversion longitudinal magnetization by applying radio frequency pulses to an object, and a first imaging step for executing continuously a plurality of first signal acquisition steps in succession to said first inversion longitudinal magnetization generation step:
    wherein each of a plurality of said first signal acquisition step comprises the steps of:
        irradiating at least one radio frequency pulse to said object and generating transverse magnetization in a selected slice region;
        generating a plurality of echo signals while phase encoding gradient magnetic fields are being applied to said object to which said transverse magnetization is applied; and
        detecting a plurality of said echo signals in a time series while a read gradient magnetic field is applied to said object, a polarity of said read gradient magnetic field being alternately changed; and
    wherein a plurality of said first signal acquisition steps select mutually different slice positions.

2. A nuclear magnetic resonance imaging method according to claim 1, wherein said first inversion longitudinal magnetization generation step generates said inversion longitudinal magnetization in a region containing all the slice positions selected by a plurality of said first signal acquisition steps, respectively.

3. A nuclear magnetic resonance imaging method including a first inversion longitudinal magnetization generation step for generating inversion longitudinal magnetization by applying radio frequency pulses to an object, and a first imaging step for executing continuously a plurality of first signal acquisition steps in succession to said first inversion longitudinal magnetization generation step:
    wherein each of a plurality of said first signal acquisition step comprises the steps of:
        irradiating at least one radio frequency pulse to said object and generating transverse magnetization in a selected slice region;
        generating a plurality of echo signals while phase encoding gradient magnetic fields are being applied to said object to which said transverse magnetization is applied; and
        detecting a plurality of said echo signals in a time series; and
    wherein a plurality of said first signal acquisition steps select mutually different slice positions;
    a second inversion longitudinal magnetization generation step for irradiating radio frequency pulses to said object and generating inversion longitudinal magnetization; and
    a second imaging step for executing continuously a plurality of second signal acquisition steps in succession to said second inversion longitudinal magnetization generation step;
    wherein each of a plurality of said second signal acquisition steps includes:
        a step for irradiating at least one radio frequency pulse to said object and generating transverse magnetization in a selected slice region;
        a step for generating a plurality of echo signals while imparting phase encode gradient magnetic fields to said object having said transverse magnetization applied thereto; and
        a step for detecting a plurality of said echo signals in a time series; and
    wherein a plurality of said second signal acquisition steps select mutually different slice positions selected by said first imaging step.

4. A nuclear magnetic resonance imaging method according to claim 3, wherein said first and second inversion longitudinal magnetization generation steps include a step for generating inversion longitudinal magnetization in regions having mutually different sizes.

5. A nuclear magnetic resonance imaging method according to claim 4, further comprising:
    a step for determining difference data for the same slice between said echo signals acquired by said first imaging step and said echo signals acquired by said second imaging step; and
    a step for reconstructing an image on the basis of said difference data.

6. A nuclear magnetic resonance imaging method according to claim 4, further comprising:
    a step of iterating a set of process steps of said first inversion longitudinal magnetization step, said first imaging step, said second inversion longitudinal magnetization generation step and said second imaging step for a plurality of sets;
        wherein an order of said slices selected by said first imaging step and by said second imaging step is serially changed in the iteration of a plurality of said sets.

7. A nuclear magnetic resonance imaging method according to claim 6, further comprising:
   a step for determining difference data for the same slice between said echo signals acquired by said first imaging step and said echo signals acquired by said second imaging step; and
   a step for reconstructing said image on the basis of said difference data.

8. A nuclear magnetic resonance imaging method including a first inversion longitudinal magnetization generation step for generating inversion longitudinal magnetization by irradiating radio frequency pulses to an object, a first imaging step for executing continuously a plurality of first signal acquisition steps after said first inversion longitudinal magnetization generation step, a second inversion longitudinal magnetization generation step for generating inversion longitudinal magnetization by applying radio frequency pulses to said object, and a second imaging step for executing continuously a plurality of second signal acquisition steps after said second inversion longitudinal magnetization generation step;
   wherein each of a plurality of said first and second signal acquisition steps includes:
      a step for irradiating at least one radio frequency pulse to said object and generating transverse magnetization in a selected slice region;
      a step for generating a plurality of echo signals while applying phase encode gradient magnetic fields to said object having said transverse magnetization applied thereto; and
      a step for detecting a plurality of said echo signals in a time series;
   wherein said first and second inversion longitudinal magnetization generation steps generate said inversion longitudinal magnetization in regions having mutually different sizes;
   wherein a plurality of said first and second signal acquisition steps selecting one and the same slice position; and
   wherein an inversion time TI1, TI2, . . . , TIn (where n is an integer) from the end point of said first inversion longitudinal magnetization step to each of a plurality of said first signal acquisition steps is the same as the inversion time from the end point of said second inversion longitudinal magnetization generation step to the irradiation of said radio frequency pulse in each of a plurality of said second signal acquisition steps.

9. A nuclear resonance imaging method according to claim 8, further comprising:
   a step for determining difference data for the same inversion time between said echo signals acquired by said first imaging step and said echo signals acquired by said second imaging step; and
   a step for reconstructing said image on the basis of said difference data.

10. A nuclear magnetic imaging method including a first inversion longitudinal magnetization generation step for generating inversion longitudinal magnetization by irradiating radio frequency pulses to an object, a first imaging step for executing continuously a plurality of first signal acquisition steps after said first inversion longitudinal magnetization generation step, a second inversion longitudinal magnetization generation step for generating inversion longitudinal magnetization by irradiating radio frequency pulses to said object after said first imaging step, and a second imaging step for executing continuously a plurality of second signal acquisition steps after said second inversion longitudinal magnetization generation step;
   wherein each of a plurality of said first and second signal acquisition steps includes:
      a step for irradiating at least one radio frequency pulse to said object and generating transverse magnetization in a selected slice region;
      a step for generating a plurality of echo signals while phase encode gradient magnetic fields are being applied to said object having said transverse magnetization applied thereto; and
      a step for detecting a plurality of said echo signals in a time series; and
   wherein said first and second inversion longitudinal magnetization generation steps generate said inversion longitudinal magnetization in regions having mutually different sizes, and a plurality of said first and second signal acquisition steps include a step for selecting one and the same slice position and applying mutually different phase encode pulses.

11. A nuclear magnetic resonance imaging method according to claim 10, further comprising:
   a step for transforming said echo signals acquired by said first imaging step by two-dimensional Fourier transform and acquiring first image data;
   a step for transforming said echo signals acquired by said second imaging step by two-dimensional Fourier transform and acquiring second image data; and
   a step for reconstructing one image on the basis of difference data between said first and second image data.

12. A nuclear magnetic resonance imaging method including a first inversion longitudinal magnetization generation step for generating inversion longitudinal magnetization by irradiating radio frequency pulses to an object containing magnetization to be detected, a first imaging step for executing continuously a plurality of first signal acquisition steps after said first inversion longitudinal magnetization generation step, a second inversion longitudinal magnetization generation step for generating inversion longitudinal magnetization by irradiating radio frequency pulses to said object after said first imaging step, and a second imaging step for executing continuously a plurality of second signal acquisition steps after said second inversion magnetization generation step:
   wherein each of a plurality of said first and second signal acquisition steps includes:
      a step for irradiating at least one radio frequency pulse to said object and generating transverse magnetization in a selected slice region;
      a step for applying mutually different slice encode gradient magnetic fields to said object having said transverse magnetization applied thereto;
      a step for applying different phase encode gradient magnetic fields to said object having said transverse magnetization applied thereto, and generating a plurality of echo signals; and
      a step for detecting a plurality of said echo signals in a time series; and
   wherein each of said first and second inversion longitudinal magnetization generation steps generates said inversion longitudinal magnetization in regions having mutually different sizes.

13. A nuclear magnetic resonance imaging method according to claim 12, further including:

a step for transforming said echo signals acquired by said first imaging step by three-dimensional Fourier transform, and acquiring first three-dimensional image data;

a step for transforming said echo signals acquired by said second imaging step by three-dimensional Fourier transform, and acquiring second three-dimensional image data; and a step for reconstructing one three-dimensional image on the basis of difference data between said first and second image data.

14. A nuclear magnetic resonance imaging method according to any of claims 3, 8, 10 and 12, wherein a plurality of said first and second signal acquisition steps irradiate a plurality of radio frequency pulses while gradient magnetic fields in a readout direction are being applied, then irradiate 18011 radio frequency pulses while slice selecting gradient magnetic fields are being applied, serially generate the same number of sets of said echo signals corresponding to a plurality of said radio frequency pulses while said gradient magnetic fields in the readout direction are being inverted, apply in this instance mutually different phase encode gradient magnetic field pulses whenever said gradient magnetic fields in the readout direction invert, and detect said sets of a plurality of said echo signals in a time series.

15. A nuclear magnetic resonance imaging apparatus including a static magnetic field generation unit, a gradient magnetic field generation unit, a radio frequency pulse generation unit, a signal detection unit, a signal processing unit, a display unit and a control unit for controlling the overall operations of said nuclear magnetic resonance imaging apparatus:

wherein said control unit executes;
first control for irradiating radio frequency pulses to an object and generating first inversion longitudinal magnetization;
second control for conducting control in such a manner as to execute a plurality of first signal acquisition sequences in succession to said first inversion longitudinal magnetization generation; and
wherein said second control is executed so that at least one radio frequency pulse is irradiated to said object in each of a plurality of said first signal acquisition sequences, transverse magnetization is generated in a selected slice region, a plurality of echo signals are generated while phase encode gradient magnetic fields are being applied to said object having said transverse magnetization applied thereto, said signal detection unit is caused to detect a plurality of said echo signals in time series while a read gradient magnetic field is applied to said object, a polarity of said read gradient magnetic field being alternately changed, and mutually different slice positions are selected in each of a plurality of said first signal acquisition sequences.

16. A nuclear magnetic resonance imaging apparatus according to claim 15, wherein said first control is executed so that said first inversion longitudinal magnetization is generated in a region containing all the slice positions selected by a plurality of first signal acquisition sequences.

17. A nuclear magnetic resonance imaging apparatus including a static magnetic field generation unit, a gradient magnetic field generation unit, a radio frequency pulse generation unit, a signal detection unit, a signal processing unit, a display unit and a control unit for controlling the overall operations of said nuclear magnetic resonance imaging apparatus:

wherein said control unit executes;
first control for irradiating radio frequency pulses to an object and generating first inversion longitudinal magnetization;
second control for conducting control in such a manner as to execute a plurality of first signal acquisition sequences in succession to said first inversion longitudinal magnetization generation; and
wherein said second control is executed so that at least one radio frequency pulse is irradiated to said object in each of a plurality of said first signal acquisition sequences, transverse magnetization is generated in a selected slice region, a plurality of echo signals are generated while phase encode gradient magnetic fields are being applied to said object having said transverse magnetization applied thereto, said signal detection unit is caused to detect a plurality of said echo signals in time series, and mutually different slice positions are selected in each of a plurality of said first signal acquisition sequences;
wherein said control unit further executes:
a third control for irradiating radio frequency pulses to said object and generating second inversion longitudinal magnetization; and
a fourth control for executing continuously a plurality of second signal acquisition sequences in succession to said second inversion longitudinal magnetization generation; and
wherein said fourth control is executed so that at least one radio frequency pulse is irradiated to said object in each of a plurality of said second signal acquisition sequences, transverse magnetization is generated in a selected slice region, a plurality of echo signals are generated while phase encode gradient magnetic fields are applied to said object having said transverse magnetization applied thereto, a plurality of said echo signals are detected in a time series by said signal detection unit, and a plurality of said second signal acquisition sequences select mutually different slice positions selected by a plurality of said first signal acquisition sequences.

18. A nuclear magnetic resonance imaging apparatus according to claim 17, wherein said first and third controls are executed so that said inversion longitudinal magnetization is generated in regions having mutually different sizes.

19. A nuclear magnetic resonance imaging apparatus according to claim 18, wherein said signal processing unit includes:

a first processing unit for determining difference data for the same slice between said echo signals acquired by a plurality of said first signal acquisition sequence and said echo signals acquired by a plurality of said second signal sequence; and a second processing unit for reconstructing an image on the basis of said difference data.

20. A nuclear magnetic resonance imaging apparatus according to claim 18, wherein said control unit executes control so that said first inversion longitudinal magnetization generation, a plurality of said first signal acquisition sequences, said second inversion longitudinal magnetization generation and a plurality of said signal acquisition sequences are iterated as one set for a plurality of sets, and an order of slices selected in a plurality of said first signal acquisition sequences and in a plurality of said second signal acquisition sequences is serially changed during the iteration of a plurality of said sets.

21. A nuclear magnetic resonance imaging apparatus according to claim 20, wherein said signal processing unit includes:

a first processing unit for determining difference data for the same slice between said echo signals acquired by a plurality of said first signal acquisition sequences and said echo signals acquired by a plurality of said signal acquisition sequences; and a second processing unit for reconstructing an image on the basis of said difference data.

22. A nuclear magnetic resonance imaging apparatus including a static magnetic field generation unit, a gradient magnetic field generation unit, a radio frequency pulse generation unit, a signal detection unit, a signal processing unit, a display unit and a control unit for controlling the overall operations of said nuclear resonance imaging apparatus:

wherein said control unit executes:
first control for irradiating radio frequency pulses to an object and generating first inversion longitudinal magnetization;
second control for executing continuously a plurality of first signal acquisition sequences in succession to said first inversion longitudinal magnetization generation;
third control for irradiating radio frequency pulses to said object after a plurality of said first signal acquisition sequences and generating second inversion longitudinal magnetization; and
fourth control for executing continuously a plurality of second signal acquisition sequences in succession to said second inversion longitudinal magnetization generation;
said first and third controls being made so that said inversion longitudinal magnetization is generated in regions having mutually different sizes;
said second and fourth controls being made so that at least one radio frequency pulse is applied to said object in each of a plurality of said first and second signal acquisition sequences to generate transverse magnetization in a selected slice region, a plurality of echo signals are generated while phase encode gradient magnetic fields are being applied to said object having said transverse magnetization applied thereto, said signal detection unit detects a plurality of said encode signals in a time series, said first and second signal acquisition sequences select one and the same slice position, and an inversion time TI1, TI2, . . . , TIn (where n is an integer) from the end point of said first inversion longitudinal magnetization generation to the irradiation of said radio frequency pulse in each of a plurality of said first signal acquisition sequences is the same as an inversion time from the end point of said second inversion longitudinal magnetization generation to the irradiation of said radio frequency pulse in each of a plurality of said second signal acquisition sequence.

23. A nuclear magnetic resonance imaging apparatus according to claim 22, wherein said signal processing unit includes:

a first processing unit for determining difference data for the same inversion time between said echo signals acquired by a plurality of said first signal acquisition sequences and said echo signals acquired by a plurality of said second signal acquisition sequences; and a second processing unit for reconstructing an image on the basis of said difference data.

24. A nuclear magnetic resonance imaging apparatus including a static magnetic field generation unit, a gradient magnetic field generation unit, a radio frequency pulse generation unit, a signal detection unit, a signal processing unit, a display unit and a control unit for controlling the overall operations of said nuclear magnetic resonance apparatus;

wherein said control unit executes:
first control for irradiating radio frequency pulses to an object and generating first inversion longitudinal magnetization;
second control for executing continuously a plurality of first signal acquisition sequences in succession to said first inversion longitudinal magnetization generation;
third control for irradiating radio frequency pulses to said object after a plurality of said first signal acquisition sequences and generating second inversion longitudinal magnetization;
fourth control for executing continuously a plurality of second signal acquisition sequences in succession to said second inversion longitudinal magnetization;
wherein said first and third controls are made in such a fashion that said inversion longitudinal magnetization is generated in regions having mutually different sizes; and
wherein said second and fourth controls are made in such a fashion that at least one radio frequency pulse is irradiated to said object in each of a plurality of said first and second signal acquisition sequences to generate transverse magnetization in a selected slice region, a plurality of echo signals are generated while phase encode gradient magnetic fields are being applied to said object having said transverse magnetization applied thereto, said signal detection unit detects a plurality of said echo signals in a time series, a plurality of said first and second signal acquisition sequences acquire one and the same slice position, and mutually different phase encode gradient magnetic fields are applied.

25. A nuclear magnetic resonance imaging apparatus according to claim 24, wherein said signal processing unit includes:

a first processing unit for transforming said echo signals acquired by said first signal acquisition sequences by two-dimensional Fourier transform and acquiring first image data;

a second processing unit for transforming said echo signals acquired by said second signal acquisition sequences by two-dimensional Fourier transform and acquiring second image data; and a third processing unit for reconstructing one image on the basis of difference data on the basis of first and second image data.

26. A nuclear magnetic resonance imaging apparatus including a static magnetic field generation unit, a gradient magnetic field generation unit, a radio frequency pulse generation unit, a signal detection unit, a signal processing unit, a display unit and a control unit for controlling the overall operations of said nuclear magnetic resonance imaging apparatus, wherein said control unit executes:

first control for irradiating radio frequency pulses to an object and generating first inversion longitudinal magnetization;

second control for executing continuously a plurality of first signal acquisition sequences in succession to said first inversion longitudinal magnetization generation;

third control for irradiating radio frequency pulses to said object after a plurality of said first signal acquisition sequence and generating second inversion longitudinal magnetization; and fourth control for executing continuously a plurality of second signal acquisition sequences in succession to said second inversion longitudinal magnetization generation;

wherein said second and fourth controls are made in such a fashion that at least one radio frequency pulse is irradiated to said object in each of a plurality of said first and second signal acquisition sequences to generate transverse magnetization in a selected slice region, mutually different slice encode gradient magnetic fields are applied to said object having said transverse magnetization applied thereto, and said signal detection unit detects said echo signals in a time series; and wherein said first and third control are made in such a fashion that said inversion longitudinal magnetization is generated in regions having mutually different sizes.

27. A nuclear magnetic resonance imaging apparatus according to claim 26, wherein said signal processing unit includes:

a first processing unit for transforming echo signals acquired by said first signal acquisition sequences by three-dimensional Fourier transform and acquiring first three-dimensional image data;

a second processing unit for transforming echo signals acquired by said second signal acquisition sequences by three-dimensional Fourier transform and acquiring second three-dimensional image data; and a third processing unit for reconstructing one three-dimensional image on the basis of difference data between said first and second three-dimensional image data.

28. A nuclear magnetic resonance imaging apparatus according to any of claims 17, 22, 24 and 26, wherein said control unit executes control in such a fashion that a plurality of radio frequency pulses are applied while gradient magnetic fields in a readout direction are being applied, in each of a plurality of said first and second signal acquisition sequences, 180° radio frequency pulses are then irradiated while slice selecting gradient magnetic fields are being applied, sets of echo signal in the same number as the number of a plurality of said radio frequency pulses are serially generated while said gradient magnetic fields in the readout direction are being inverted, a different phase encode gradient magnetic field pulse is applied in this instance whenever said gradient magnetic fields in the readout direction invert, and a plurality of sets of said echo signals are detected in a time series.

29. A nuclear magnetic resonance imaging method including a first inversion longitudinal magnetization generation step for generating inversion longitudinal magnetization by applying radio frequency pulses to an object, and a first imaging step for executing continuously a plurality of first signal acquisition steps in succession to said first inversion longitudinal magnetization generation step:

wherein each of a plurality of said first signal acquisition steps comprises the steps of:

irradiating a plurality of radio frequency pulses while a gradient magnetic field in a readout direction is being applied;

irradiating a 180° radio frequency pulse while a slice selecting gradient magnetic field is being applied;

serially generating a plurality of echo signals corresponding to a plurality of said radio frequency pulses while a gradient magnetic field in a readout direction is alternately inverted and applied, and different phase encode gradient magnetic field pulses are applied at each inversion of said gradient magnetic fields in the readout direction; and detecting said echo signals corresponding to said radio frequency pulses in time series for each inversion of said gradient magnetic field in the readout direction.

30. A nuclear magnetic resonance imaging apparatus including a static magnetic field generation unit, a gradient magnetic field generation unit, a radio frequency pulse generation unit, a signal detection unit, a signal processing unit and a control unit for controlling overall operations of said nuclear magnetic resonance imaging apparatus:

wherein said control unit executes:

first control for irradiating radio frequency pulses to an object and generating first inversion longitudinal magnetization; and second control for conducting control in such a manner as to execute continuously a plurality of first signal acquisition sequences in succession to said first inversion longitudinal magnetization generation;

wherein said second control is executed so that each of said plurality of said first signal acquisition sequences includes irradiating a plurality of radio frequency pulses while a gradient magnetic field in a readout direction is applied, irradiating a 180° radio frequency pulse while a slice selecting gradient magnetic field is applied, serially generating a plurality of echo signals corresponding to a plurality of said radio frequency pulses while a gradient magnetic field in a readout direction is alternately inverted and applied with different phase encode gradient magnetic fields being applied at each inversion of said gradient magnetic fields in the readout direction, and said signal detection unit detects said echo signals corresponding to said radio frequency pulses in time series for each inversion of said gradient magnetic field in the readout direction.

* * * * *